United States Patent
Kim et al.

(10) Patent No.: US 11,634,629 B2
(45) Date of Patent: Apr. 25, 2023

(54) METHOD TO IMPROVE PERFORMANCE OF DEVICES COMPRISING NANOSTRUCTURES

(71) Applicant: Nanosys, Inc., Milpitas, CA (US)

(72) Inventors: Daekyoung Kim, Santa Clara, CA (US); Wenzhou Guo, San Jose, CA (US); Alexander Tu, San Jose, CA (US); Yeewah Annie Chow, San Jose, CA (US); Diego Barrera, San Jose, CA (US); Christian Ippen, Cupertino, CA (US); Benjamin Newmeyer, San Jose, CA (US); Ruiqing Ma, Morristown, NJ (US)

(73) Assignee: Nanosys, Inc., Milpitas, CA (US)

( * ) Notice: Subject to any disclaimer, the term of this patent is extended or adjusted under 35 U.S.C. 154(b) by 214 days.

(21) Appl. No.: 16/925,786

(22) Filed: Jul. 10, 2020

(65) Prior Publication Data
US 2021/0013377 A1 Jan. 14, 2021

Related U.S. Application Data

(60) Provisional application No. 62/872,912, filed on Jul. 11, 2019.

(51) Int. Cl.
| | |
|---|---|
| *H01L 33/50* | (2010.01) |
| *C09K 11/88* | (2006.01) |
| *H01L 33/06* | (2010.01) |
| *H01L 29/06* | (2006.01) |
| *C09K 11/70* | (2006.01) |

(52) U.S. Cl.
CPC .......... *C09K 11/703* (2013.01); *C09K 11/883* (2013.01); *H01L 29/0665* (2013.01); *H01L 33/06* (2013.01); *H01L 33/502* (2013.01)

(58) Field of Classification Search
CPC ........................... C09K 11/703; C09K 11/883
See application file for complete search history.

(56) References Cited

U.S. PATENT DOCUMENTS

| | | | | |
|---|---|---|---|---|
| 11,220,630 | B2 * | 1/2022 | Hens | ...................... C09K 11/70 |
| 11,365,348 | B2 * | 6/2022 | Park | ...................... C09K 11/883 |
| 2018/0044586 | A1 | 2/2018 | Kwon et al. | |

(Continued)

FOREIGN PATENT DOCUMENTS

| | | |
|---|---|---|
| EP | 2853578 A1 | 4/2015 |
| WO | WO-2018178137 A1 | 10/2018 |

(Continued)

OTHER PUBLICATIONS

International Search Report and Written Opinion for Application No. PCT/US2020/041501 dated Nov. 10, 2020, European Patent Office, Netherlands, 12 Pages.

(Continued)

*Primary Examiner* — Tracie Y Green
(74) *Attorney, Agent, or Firm* — Sterne, Kessler, Goldstein & Fox P.L.L.C.

(57) ABSTRACT

The invention is in the field of nanostructure synthesis. Provided are highly luminescent core/shell nanostructures with zinc fluoride and zinc acetate bound to their surface. Also provided are methods of preparing the nanostructures, films comprising the nanostructures, and devices comprising the nanostructures.

13 Claims, 4 Drawing Sheets

(56) References Cited

U.S. PATENT DOCUMENTS

2019/0382656 A1\* 12/2019 Mocatta ............... C09K 11/025
2021/0054273 A1\* 2/2021 Moriyama ......... C09K 11/0883

FOREIGN PATENT DOCUMENTS

WO     WO-2018193445 A1    10/2018
WO     WO-2020154322 A1     7/2020

OTHER PUBLICATIONS

Lim, J., et al., "Highly Efficient Cadmium-Free Quantum Dot Light-Emitting Diodes Enabled by the Direct Formation of Excitons within Inp@Znses Quantum Dots," *ACS Nano*, 7(10):9019-9026, American Chemical Society, United States (Oct. 2013).

Xiang, C., et al., "The Dawn of Qled for the FPD industry," *Information Display*, 34(6):14-17, John Wiley & Sons, Inc., United States (Dec. 2018).

\* cited by examiner

METHOD TO IMPROVE PERFORMANCE OF DEVICES COMPRISING NANOSTRUCTURES

BACKGROUND OF THE INVENTION

Field of the Invention

The invention is in the field of nanostructure synthesis. Provided are highly luminescent nanostructures that have been surface treated with zinc acetate and zinc fluoride. Also provided are methods of preparing the nanostructures, films comprising the nanostructures, and devices comprising the nanostructures.

Background of the Invention

ZnS has been widely used as a shell material in quantum dot (QD) light emitting diodes for Cd based core QDs due to its stable shell, good energy level alignment and less lattice mismatch between the core and shell. Device performance has been improved over the last decade by changing the shell composition and thickness (e.g., Cd(core)/ZnS (shell)). Despite the promising outlook, the commercialization of QLEDs comprising cadmium QDs is strictly restricted because cadmium is considered a hazardous substance.

Among potential replacements for Cd-based II-VI compounds, InP QDs have been suggested as the most promising candidate for light-emitting applications due to their band gap tunability covering the entire visible range and narrow spectral bandwidth.

However, a ZnS shell couldn't be adapted for InP cores because of a large lattice mismatch, high lattice strain between the core/shell, too strong hole confinement in InP core, high hole injection barrier from organic hole transport layer to QDs, due to deep HOMO ZnS shell as shown in FIG. 1, and slow hole mobility compared to electrons.

In an effort to minimize these deficiencies, ZnSe or gradient ZnSeS has been used as a buffer layer between the InP core and ZnS shell to minimize lattice mismatch and lattice strain. But the quantum yield (QY) of InP QDs is reduced with thicker ZnSe shells, which means that ZnSe or gradient ZnSeS in the buffer layer does not minimize lattice mismatch and lattice strain.

A need exists for core-shell nanostructure compositions that have improved stability and improved optical properties when used to prepare a nanostructure film.

BRIEF SUMMARY OF THE INVENTION

Provided are InP core-shell nanostructure compositions with improved external quantum efficiency (EQE) and stability when used in devices. Also provided are core/shell nanostructures with a zinc carboxylate and zinc halide bound to their surface.

Provided is a population of nanostructures comprising a nanocrystal core and at least one shell with a zinc carboxylate and zinc halide bound to its surface. In some embodiments, the nanocrystal core is selected from the group consisting of Si, Ge, Sn, Se, Te, B, C, P, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, Pb Se, PbTe, CuF, CuCl, CuBr, CuI, $Si_3N_4$, $Ge_3N_4$, $Al_2O_3$, $Al_2CO$, and combinations thereof.

In some embodiments, the nanocrystal core comprises InP. In some embodiments, the nanocrystal core comprises CdSe.

In some embodiments, the at least one shell is ZnSe. In some embodiments, the thickness of the at least one shell is about 1 nm. In some embodiments, the nanostructures have a diameter of about 4-12 nm.

In some embodiments, the nanostructions are InP/ZnSe core-shell nanostructures.

In some embodiments, the nanostructures are Cd/ZnSe core-shell nanostructures.

In some embodiments, the nanostructures have a full width half maximum (FWHM) emission spectrum of less than 40 nm. In some embodiments, the nanostructions have a FWHM emission spectrum of 38-39 nm.

In some embodiments, the nanostructions have a quantum yield percent (QY %) greater than 80%. In some embodiments, the nanostructions have a QY % of 85-88%.

In some embodiments, the zinc carboxylate is zinc acetate. In some embodiments, the zinc carboxylate is zinc acetate dihydrate. In some embodiments, the zinc halide is zinc fluoride.

Also provided is a method of making the nanostructures dscribed herein, comprising:
(a) admixing core-shell nanostructures in a solvent with a zinc carboxylate and zinc halide under an inert atmosphere;
(b) raising the temperature of the admixture in (a) to a temperature between about 90° C. and about 350° C.; and
(c) isolating the core-shell nanocrystals with zinc acetate and zinc fluoride bound to its surface.

In some embodiments, the solvent comprises 1-octadecene, 1-hexadecene, 1-eicosene, eicosane, octadecane, hexadecane, tetradecane, squalene, squalane, trioctylphosphine oxide, trioctylamine, trioctylphosphine, or dioctyl ether, or combinations thereof. In some embodiments, the solvent comprises 1-octadecene.

In some embodiments, the admixing in (a) is at a temperature between about 0° C. and about 150° C.

In some embodiments, the nanostructures are InP/ZnSe core-shell nanostructures.

In some embodiments, the zinc carboxylate is zinc acetate. In some embodiments, the zinc acetate is in the form of zinc acetate dihydrate.

In some embodiments, the InP/Se core/shell nanocrystals are obtained by
(d) adding InP cores to a solution comprising solvent, a ligand and zinc chloride under an inert atmosphere at a temperature of about 80° C. to about 150° C.;
(e) adding zinc bromide and gallium trichloride to the solution obtained in (d);
(f) adding a selenium source to the solution obtained in (e);
(g) heating the solution obtained in (f) to a temperature of about 150° C. to about 340° C.; and
(h) allowing the solution obtained in (g) to cool.

In some embodiments, the solvent in (d) comprises 1-octadecene, 1-hexadecene, 1-eicosene, eicosane, octadecane, hexadecane, tetradecane, squalene, squalane, trioctylphosphine oxide, trioctylamine, trioctylphosphine, or dioctyl ether, or combinations thereof. In some embodiments, the solvent in (d) comprises 1-octadecene.

In some embodiments, the ligand is a fatty acid. In some embodiments, the fatty acid is lauric acid.

Also provided is a nanostructure film comprising:
(a) at least one population of nanostructures described herein; and
(b) at least one organic resin.

In some embodiments, the nanostructures are embedded in a maxtrix that forms the film.

Also provided is a nanostructure molded article comprising:
(a) a first conductive layer;
(b) a second conductive layer; and
(c) a nanostructure layer between the first conductive layer and the second conductive layer, wherein the nanostructure layer comprises a population of nanostructures described herein.

Also provided is a display device comprising the nanostructures described herein. In some embodiments, the display device comprese a film comprising the nanostructures. In some embodiments, the nanostructures are embedded in a matrix that forms the film. In some embodiments, the film is disposed on a light guide plate.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION OF THE INVENTION

Figure 1:
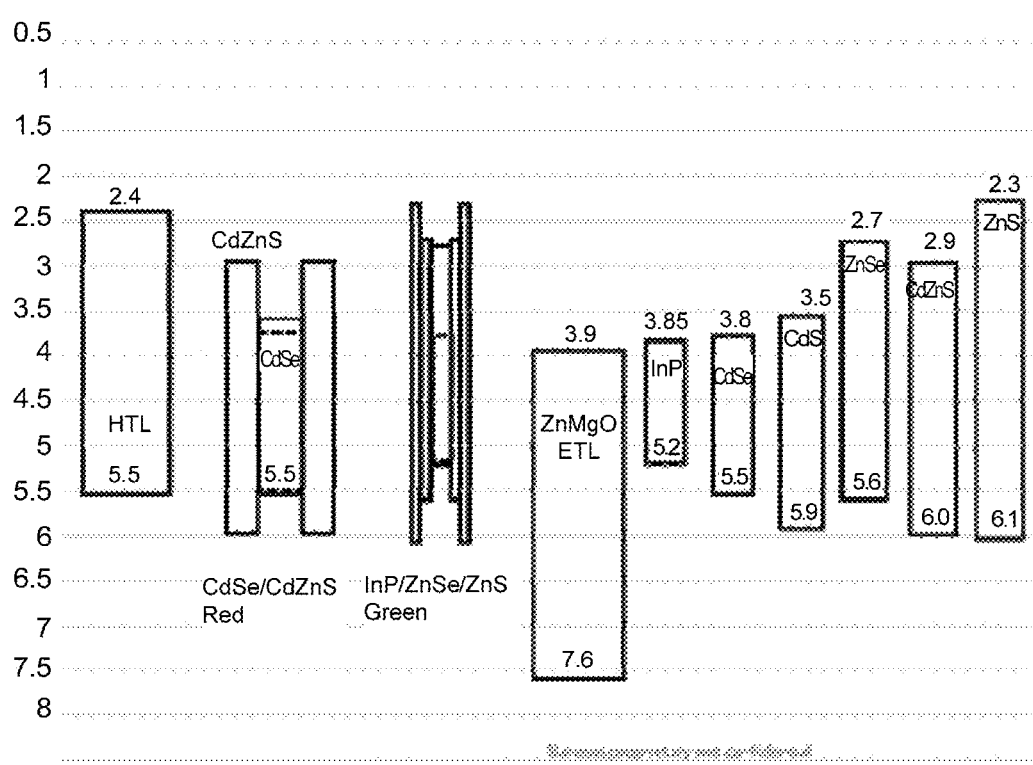
FIG. 1 is a schematic diagram depicting the energy levels of CdSe based QDs and InP/ZnSe/ZnS QDs, an organic hole transport layer (HTL) and an inorganic electron transport layer (ETL).
Figure 2:
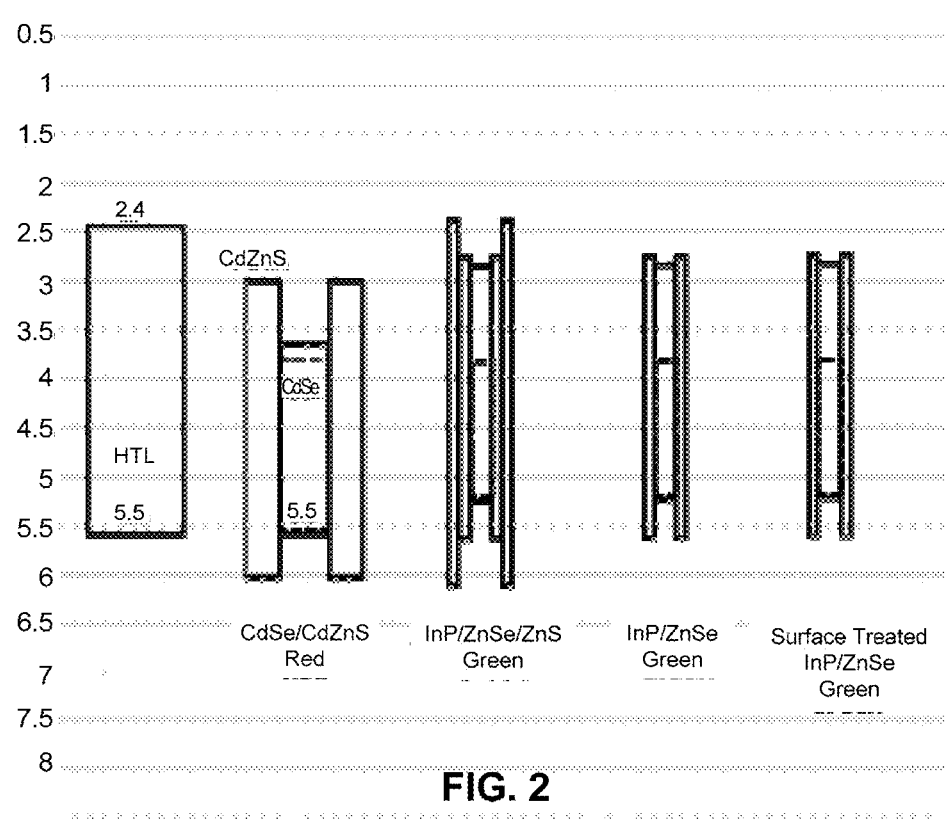
FIG. 2 is a schematic diagram depicting the energy levels of an HTL, CdSe/CdZnS QDs, InP/ZnSe/ZnS QDs, InP/ZnSe QDs, and surface treated InP/ZnSe QDs.
Figure 3A:
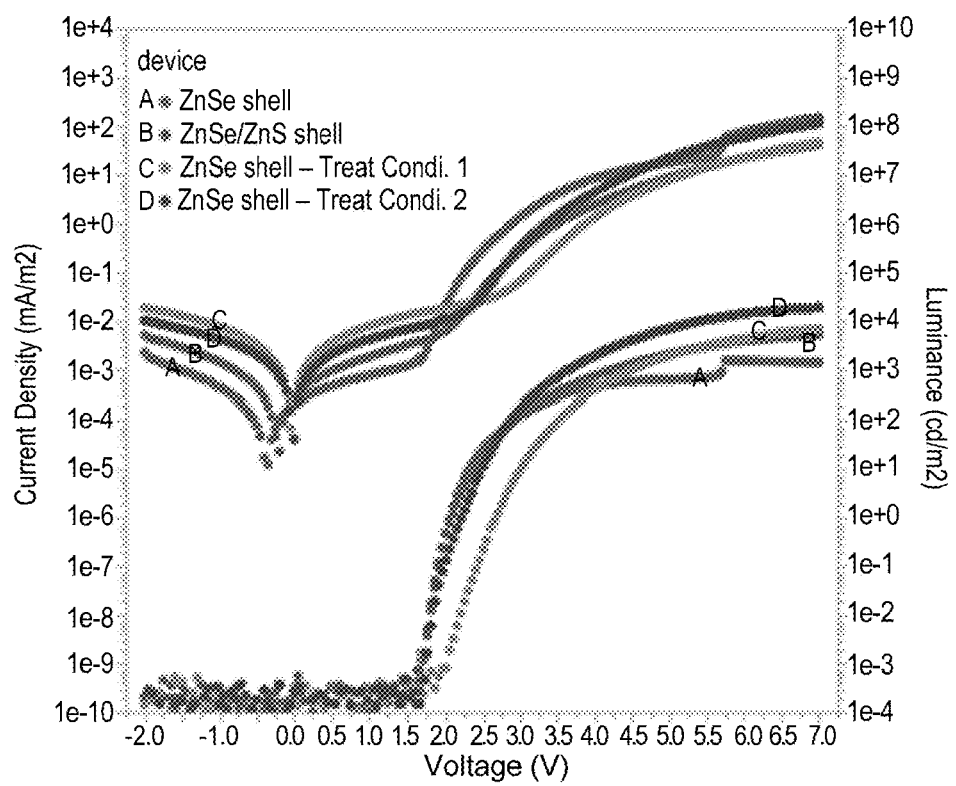
FIG. 3A is a graph depicting the current density versus voltage and luminescence versus voltage of various QDs in devices.
Figure 3B:
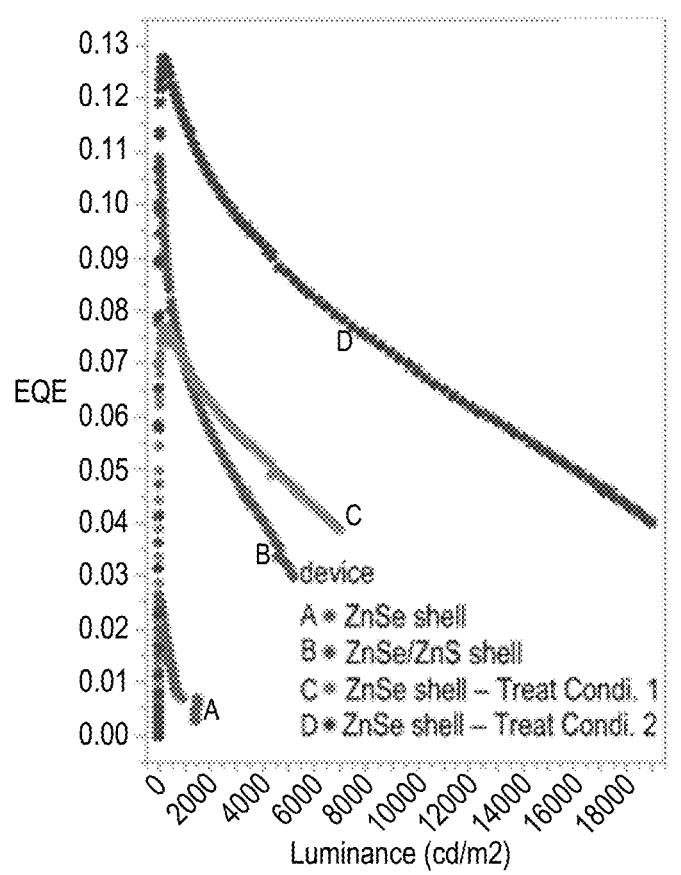
FIG. 3B is a graph depicting the EQE versus luminescence of various QDs in devices.

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in practice for testing, the preferred materials and methods are described herein. Accordingly, the terminology used herein is for the purpose of describing particular embodiments only, and is not intended to be limiting.

As used in this specification and the appended claims, the singular forms "a," "an," and "the" include plural referents unless the context clearly dictates otherwise. Thus, for example, reference to "a nanostructure" includes a plurality of such nanostructures, and the like.

The term "about" as used herein indicates the value of a given quantity varies by ±10% of the value. For example, "about 100 nm" encompasses a range of sizes from 90 nm to 110 nm, inclusive.

A "nanostructure" is a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, quantum dots, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

A "nanocrystal" is a nanostructure that is substantially monocrystalline. A nanocrystal thus has at least one region or characteristic dimension with a dimension of less than about 500 nm. In some embodiments, the nanocrystal has a dimension of less than about 200 nm, less than about 100 nm, less than about 50 nm, less than about 20 nm, or less than about 10 nm. The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. In some embodiments, each of the three dimensions of the nanocrystal has a dimension of less than about 500 nm, less than about 200 nm, less than about 100 nm, less than about 50 nm, less than about 20 nm, or less than about 10 nm.

The term "quantum dot" (or "dot") refers to a nanocrystal that exhibits quantum confinement or exciton confinement. Quantum dots can be substantially homogenous in material properties, or in certain embodiments, can be heterogeneous, e.g., including a core and at least one shell. The optical properties of quantum dots can be influenced by their particle size, chemical composition, and/or surface composition, and can be determined by suitable optical testing available in the art. The ability to tailor the nanocrystal size, e.g., in the range between about 1 nm and about 15 nm, enables photoemission coverage in the entire optical spectrum to offer great versatility in color rendering.

A "ligand" is a molecule capable of interacting (whether weakly or strongly) with one or more facets of a nanostructure, e.g., through covalent, ionic, van der Waals, or other molecular interactions with the surface of the nanostructure.

"Photoluminescence quantum yield" (PLQY) is the ratio of photons emitted to photons absorbed, e.g., by a nanostructure or population of nanostructures. As known in the art, quantum yield is typically determined by a comparative method using well-characterized standard samples with known quantum yield values.

"Peak emission wavelength" (PWL) is the wavelength where the radiometric emission spectrum of the light source reaches its maximum.

As used herein, the term "shell" refers to material deposited onto the core or onto previously deposited shells of the same or different composition and that result from a single act of deposition of the shell material. The exact shell thickness depends on the material as well as the precursor input and conversion and can be reported in nanometers or monolayers. As used herein, "target shell thickness" refers to the intended shell thickness used for calculation of the required precursor amount. As used herein, "actual shell thickness" refers to the actually deposited amount of shell material after the synthesis and can be measured by methods known in the art. By way of example, actual shell thickness can be measured by comparing particle diameters determined from transmission electron microscopy (TEM) images of nanocrystals before and after a shell synthesis.

As used herein, the term "full width at half-maximum" (FWHM) is a measure of the size distribution of nanoparticles. The emission spectra of nanoparticles generally have the shape of a Gaussian curve. The width of the Gaussian curve is defined as the FWHM and gives an idea of the size distribution of the particles. A smaller FWHM corresponds to a narrower quantum dot nanocrystal size distribution. FWHM is also dependent upon the peak emission wavelength.

As used herein, the term "half width at half-maximum" (HWHM) is a measure of the size distribution of nanoparticles extracted from UV-vis spectroscopy curves. A HWHM on the low-energy side of the first exciton absorption peak can be used as a suitable indicator of the size distribution, with smaller HWHM values corresponding to narrower size distributions.

Nanostructure Composition

In some embodiments, the present disclosure provides a nanostructure composition comprising core-shell nanostructures that have been surface treated with zinc acetate and zinc fluoride.

In some embodiments, the present disclosure provides a nanostructure composition comprising InP/ZnSe core-shell nanostructures. In some embodiments, the ZnSe shell has a thickness of between about 0.01 nm and about 5 nm.

In some embodiments, the nanostructure is a quantum dot.

Nanostructure Core

The quantum dots (or other nanostructures) for use in the present invention can be produced from any suitable material, suitably an inorganic material, and more suitably an inorganic conductive or semiconductive material. Suitable semiconductor materials include any type of semiconductor, including Group II-VI, Group III-V, Group IV-VI, and Group IV semiconductors. Suitable semiconductor materials include, but are not limited to, Si, Ge, Sn, Se, Te, B, C (including diamond), P, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $Al_2CO$, and combinations thereof.

The synthesis of Group II-VI nanostructures has been described in U.S. Pat. Nos. 6,225,198, 6,322,901, 6,207,229, 6,607,829, 6,861,155, 7,060,243, 7,125,605, 7,374,824, 7,566,476, 8,101,234, and 8,158,193 and in U.S. Patent Appl. Publication Nos. 2011/0262752 and 2011/0263062. In some embodiments, the core is a Group II-VI nanocrystal selected from the group consisting of ZnO, ZnSe, ZnS, ZnTe, CdO, CdSe, CdS, CdTe, HgO, HgSe, HgS, and HgTe. In some embodiments, the core is a nanocrystal selected from the group consisting of ZnSe, ZnS, CdSe, and CdS.

Although Group II-VI nanostructures such as CdSe and CdS quantum dots can exhibit desirable luminescence behavior, issues such as the toxicity of cadmium limit the applications for which such nanostructures can be used. Less toxic alternatives with favorable luminescence properties are thus highly desirable. Group III-V nanostructures in general and InP-based nanostructures in particular, offer the best known substitute for cadmium-based materials due to their compatible emission range.

Synthesis of InP-based nanostructures has been described, e.g., in Xie, R., et al., "Colloidal InP nanocrystals as efficient emitters covering blue to near-infrared," *J. Am. Chem. Soc.* 129:15432-15433 (2007); Micic, O. I., et al., "Core-shell quantum dots of lattice-matched ZnCdSe2 shells on InP cores: Experiment and theory," *J. Phys. Chem. B* 104:12149-12156 (2000); Liu, Z., et al., "Coreduction colloidal synthesis of III-V nanocrystals: The case of InP," *Angew. Chem. Int. Ed. Engl.* 47:3540-3542 (2008); Li, L. et al., "Economic synthesis of high quality InP nanocrystals using calcium phosphide as the phosphorus precursor," *Chem. Mater.* 20:2621-2623 (2008); D. Battaglia and X. Peng, "Formation of high quality InP and InAs nanocrystals in a noncoordinating solvent," *Nano Letters* 2:1027-1030 (2002); Kim, S., et al., "Highly luminescent InP/GaP/ZnS nanocrystals and their application to white light-emitting diodes," *J. Am. Chem. Soc.* 134:3804-3809 (2012); Nann, T., et al., "Water splitting by visible light: A nanophotocathode for hydrogen production," *Angew. Chem. Int. Ed.* 49:1574-1577 (2010); Borchert, H., et al., "Investigation of ZnS passivated InP nanocrystals by XPS," *Nano Letters* 2:151-154 (2002); L. Li and P. Reiss, "One-pot synthesis of highly luminescent InP/ZnS nanocrystals without precursor injection," *J. Am. Chem. Soc.* 130:11588-11589 (2008); Hussain, S., et al. "One-pot fabrication of high-quality InP/ZnS (core/shell) quantum dots and their application to cellular imaging," *Chemphyschem.* 10:1466-1470 (2009); Xu, S., et al., "Rapid synthesis of high-quality InP nanocrystals," *J. Am. Chem. Soc.* 128:1054-1055 (2006); Micic, O. I., et al., "Size-dependent spectroscopy of InP quantum dots," *J. Phys. Chem. B* 101:4904-4912 (1997); Haubold, S., et al., "Strongly luminescent InP/ZnS core-shell nanoparticles," *Chemphyschem.* 5:331-334 (2001); CrosGagneux, A., et al., "Surface chemistry of InP quantum dots: A comprehensive study," *J. Am. Chem. Soc.* 132:18147-18157 (2010); Micic, O. I., et al., "Synthesis and characterization of InP, GaP, and GaInP2 quantum dots," *J. Phys. Chem.* 99:7754-7759 (1995); Guzelian, A. A., et al., "Synthesis of size-selected, surface-passivated InP nanocrystals," *J. Phys. Chem.* 100: 7212-7219 (1996); Lucey, D. W., et al., "Monodispersed InP quantum dots prepared by colloidal chemistry in a non-coordinating solvent," *Chem. Mater.* 17:3754-3762 (2005); Lim, J., et al., "InP@ZnSeS, core@composition gradient shell quantum dots with enhanced stability," *Chem. Mater.* 23:4459-4463 (2011); and Zan, F., et al., "Experimental studies on blinking behavior of single InP/ZnS quantum dots: Effects of synthetic conditions and UV irradiation," *J. Phys. Chem. C* 116:394-3950 (2012). However, such efforts have had only limited success in producing InP nanostructures with high quantum yields.

In some embodiments, the InP core is doped. In some embodiments, the dopant of the nanocrystal core comprises a metal, including one or more transition metals. In some embodiments, the dopant is a transition metal selected from the group consisting of Ti, Zr, Hf, V, Nb, Ta, Cr, Mo, W, Mn, Tc, Re, Fe, Ru, Os, Co, Rh, Ir, Ni, Pd, Pt, Cu, Ag, Au, and combinations thereof. In some embodiments, the dopant comprises a non-metal. In some embodiments, the dopant is ZnS, ZnSe, ZnTe, CdSe, CdS, CdTe, HgS, HgSe, HgTe, $CuInS_2$, $CuInSe_2$, AlN, AlP, AlAs, GaN, GaP, or GaAs.

In some embodiments, the core is purified before deposition of a shell. In some embodiments, the core is filtered to remove precipitate from the core solution.

In some embodiments, the diameter of the InP core is determined using quantum confinement. Quantum confinement in zero-dimensional nanocrystallites, such as quantum dots, arises from the spatial confinement of electrons within the crystallite boundary. Quantum confinement can be observed once the diameter of the material is of the same magnitude as the de Broglie wavelength of the wave function. The electronic and optical properties of nanoparticles deviate substantially from those of bulk materials. A particle behaves as if it were free when the confining dimension is large compared to the wavelength of the particle. During this state, the bandgap remains at its original energy due to a continuous energy state. However, as the confining dimension decreases and reaches a certain limit, typically in nanoscale, the energy spectrum becomes discrete. As a result, the bandgap becomes size-dependent.

In some embodiments, the nanostructures are free from cadmium. As used herein, the term "free of cadmium" is intended that the nanostructures contain less than 100 ppm by weight of cadmium. The Restriction of Hazardous Substances (RoHS) compliance definition requires that there must be no more than 0.01% (100 ppm) by weight of cadmium in the raw homogeneous precursor materials. The cadmium level in the Cd-free nanostructures of the present invention is limited by the trace metal concentration in the precursor materials. The trace metal (including cadmium) concentration in the precursor materials for the Cd-free nanostructures, can be measured by inductively coupled plasma mass spectroscopy (ICP-MS) analysis, and are on the parts per billion (ppb) level. In some embodiments, nanostructures that are "free of cadmium" contain less than about 50 ppm, less than about 20 ppm, less than about 10 ppm, or less than about 1 ppm of cadmium.

Shell

Exemplary materials for preparing shells include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, GaSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, Pb Se, PbTe, CuF, CuCl, CuBr, CuI, $Si_3N_4$, $Ge_3N_4$, $Al_2O_3$, $Al_2CO$, and combinations thereof.

In some embodiments, the shell is a mixture of at least two of a zinc source, a selenium source, a sulfur source, a tellurium source, and a cadmium source. In some embodiments, the shell is a mixture of two of a zinc source, a selenium source, a sulfur source, a tellurium source, and a cadmium source. In some embodiments, the shell is a mixture of three of a zinc source, a selenium source, a sulfur source, a tellurium source, and a cadmium source. In some embodiments, the shell is a mixture of: zinc and sulfur; zinc and selenium; zinc, sulfur, and selenium; zinc and tellurium; zinc, tellurium, and sulfur; zinc, tellurium, and selenium; zinc, cadmium, and sulfur; zinc, cadmium, and selenium; cadmium and sulfur; cadmium and selenium; cadmium, selenium, and sulfur; cadmium and zinc; cadmium, zinc, and sulfur; cadmium, zinc, and selenium; or cadmium, zinc, sulfur, and selenium. In some embodiments, the shell is a mixture of zinc and selenium. In some embodiments, the shell is a mixture of zinc and sulfur.

Exemplary core/shell luminescent nanostructures include, but are not limited to, (represented as core/shell) CdSe/ZnSe and InP/ZnSe.

In some embodiments, the shell comprises ZnSe. The thickness of the shell can be controlled by varying the amount of precursor provided. For a given shell thickness, at least one of the precursors is optionally provided in an amount whereby, when a growth reaction is substantially complete, a shell of a predetermined thickness is obtained. In some embodiments, the molar ratio of the zinc source and the selenium source is between about 0.01:1 and about 1:1.5, about 0.01:1 and about 1:1.25, about 0.01:1 and about 1:1, about 0.01:1 and about 1:0.75, about 0.01:1 and about 1:0.5, about 0.01:1 and about 1:0.25, about 0.01:1 and about 1:0.05, about 0.05:1 and about 1:1.5, about 0.05:1 and about 1:1.25, about 0.05:1 and about 1:1, about 0.05:1 and about 1:0.75, about 0.05:1 and about 1:0.5, about 0.05:1 and about 1:0.25, about 0.25:1 and about 1:1.5, about 0.25:1 and about 1:1.25, about 0.25:1 and about 1:1, about 0.25:1 and about 1:0.75, about 0.25:1 and about 1:0.5, about 0.5:1 and about 1:1.5, about 0.5:1 and about 1:1.25, about 0.5:1 and about 1:1, about 0.5:1 and about 1:0.75, about 0.75:1 and about 1:1.5, about 0.75:1 and about 1:1.25, about 0.75:1 and about 1:1, about 1:1 and about 1:1.5, about 1:1 and about 1:1.25, or about 1:1.25 and about 1:1.5.

The thickness of the ZnSe shell layer can be controlled by varying the amount of zinc and selenium sources provided and/or by use of longer reaction times and/or higher temperatures. At least one of the sources is optionally provided in an amount whereby, when a growth reaction is substantially complete, a layer of a predetermined thickness is obtained.

The thickness of the ZnSe thin shell can be determined using techniques known to those of skill in the art. In some embodiments, the thickness of the inner thin shell is determined by comparing the average diameter of the nanostructure before and after the addition of the inner thin shell. In some embodiments, the average diameter of the nanostructure before and after the addition of the inner thin shell is determined by TEM. In some embodiments, the ZnSe shell has a thickness of between about 0.01 nm and about 0.35 nm, about 0.01 nm and about 0.3 nm, about 0.01 nm and about 0.25 nm, about 0.01 nm and about 0.2 nm, about 0.01 nm and about 0.1 nm, about 0.01 nm and about 0.05 nm, about 0.05 nm and about 0.35 nm, about 0.05 nm and about 0.3 nm, about 0.05 nm and about 0.25 nm, about 0.05 nm and about 0.2 nm, about 0.05 nm and about 0.1 nm, about 0.1 nm and about 0.35 nm, about 0.1 nm and about 0.3 nm, about 0.1 nm and about 0.25 nm, about 0.1 nm and about 0.2 nm, about 0.2 nm and about 0.35 nm, about 0.2 nm and about 0.3 nm, about 0.2 nm and about 0.25 nm, about 0.25 nm and about 0.35 nm, about 0.25 nm and about 0.3 nm, or about 0.3 nm and about 0.35 nm.

In some embodiments, the zinc source is a dialkyl zinc compound. In some embodiments, the zinc source is a zinc carboxylate. In some embodiments, the zinc source is diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof. In some embodiments, the zinc source is zinc oleate, zinc hexanoate, zinc octanoate, zinc laurate, zinc myristate, zinc palmitate, zinc stearate, zinc dithiocarbamate, or mixtures thereof. In some embodiments, the zinc source is zinc oleate.

In some embodiments, the selenium source is an alkyl-substituted selenourea. In some embodiments, the selenium source is a phosphine selenide. In some embodiments, the selenium source is selected from trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, tricyclohexylphosphine selenide, cyclohexylphosphine selenide, 1-octaneselenol, 1-dodecaneselenol, selenophenol, elemental selenium, hydrogen selenide, bis(trimethylsilyl) selenide, selenourea, and mixtures thereof. In some embodiments, the selenium source is tri(n-butyl)phosphine selenide, tri(sec-butyl)phosphine selenide, or tri(tert-butyl)phosphine selenide. In some embodiments, the selenium source is trioctylphosphine selenide.

In some embodiments, the ZnSe shell is synthesized in the presence of at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the InP core synthesis and for the shell synthesis are the same. In some embodiments, the ligand(s) for the core synthesis and for the shell synthesis are different. Following synthesis, any ligand on the surface of the nanostructures can be exchanged for a different ligand with other desirable properties. Examples of ligands are disclosed in U.S. Pat. Nos. 7,572,395, 8,143,703, 8,425,803, 8,563,133, 8,916,064, 9,005,480, 9,139,770, and 9,169,435, and in U.S. Patent Application Publication No. 2008/0118755.

Ligands suitable for the synthesis of a shell are known by those of skill in the art. In some embodiments, the ligand is a fatty acid selected from the group consisting of lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from the group consisting of dodecylamine, oleylamine, hexadecylamine, dioctylamine, and octadecylamine. In some embodiments, the ligand is oleic acid.

Production of an InP Core with ZnSe Shell—Method A

In some embodiments, the present invention is directed to a method of producing a core/shell InP/ZnSe nanostructure comprising:

(a) admixing an In source, a P source, a zinc source, and a selenium source; and (b) raising the temperature of the admixture in (a) to a temperature between about 200° C. and about 350° C.; to provide the nanostructure.

In some embodiments, a core/shell nanostructure is produced in the presence of a solvent. In some embodiments, the solvent is selected from the group consisting of 1-octadecene, 1-hexadecene, 1-eicosene, eicosane, octadecane, hexadecane, tetradecane, squalene, squalane, trioctylphosphine oxide, trioctylamine, trioctylphosphine, and dioctyl ether. In some embodiments, the solvent is 1-octadecene.

In some embodiments, the core and shell precursors are admixed in (a) at a temperature between about 0° C. and about 150° C., about 0° C. and about 100° C., about 0° C.

and about 50° C., about 0° and about 30° C., about 0° C. and about 20° C., about 20° C. and about 150° C., about 20° C. and about 100° C., about 20° C. and about 50° C., about 20° and about 30° C., about 30° C. and about 150° C., about 30° C. and about 100° C., about 30° C. and about 50° C., about 50° C. and about 150° C., about 50° C. and about 100° C., or about 100° C. and about 150° C. In some embodiments, core and shell precursors are admixed in (a) at a temperature between about 20° C. and about 30° C.

In some embodiments, the zinc source is zinc chloride.

In some embodiments, the selenium source is selenium powder.

In some embodiments, the temperature of the admixture is raised in (b) to a temperature between about 200° C. and about 350° C., about 200° C. and about 310° C., about 200° C. and about 280° C., about 200° C. and about 250° C., about 200° C. and about 225° C., about 225° C. and about 350° C., about 225° C. and about 310° C., about 225° C. and about 280° C., about 225° C. and about 250° C., about 250° C. and about 350° C., about 250° C. and about 310° C., about 250° C. and about 280° C., about 280° C. and about 350° C., about 280° C. and about 310° C., or about 310° C. and about 350° C. In some embodiments, the temperature of the admixture is elevated in (b) to a temperature between about 280° C. and about 310° C.

In some embodiments, the time for the temperature to reach the elevated temperature in (b) is between about 2 minutes and about 240 minutes, about 2 minutes and about 200 minutes, about 2 minutes and about 100 minutes, about 2 minutes and about 60 minutes, about 2 minutes and about 40 minutes, about 5 minutes and about 240 minutes, about 5 minutes and about 200 minutes, about 5 minutes and about 100 minutes, about 5 minutes and about 60 minutes, about 5 minutes and about 40 minutes, about 10 minutes and about 240 minutes, about 10 minutes and about 200 minutes, about 10 minutes and about 100 minutes, about 10 minutes and about 60 minutes, about 10 minutes and about 40 minutes, about 40 minutes and about 240 minutes, about 40 minutes and about 200 minutes, about 40 minutes and about 100 minutes, about 40 minutes and about 60 minutes, about 60 minutes and about 240 minutes, about 60 minutes and about 200 minutes, about 60 minutes and about 100 minutes, about 100 minutes and about 240 minutes, about 100 minutes and about 200 minutes, or about 200 minutes and about 240 minutes.

In some embodiments, after the admixture reaches the elevated temperature in (b), the temperature is maintained for a period of between about 1 minute and about 240 minutes, about 1 minute and about 90 minutes, about 1 minute and about 60 minutes, about 1 minute and about 30 minutes, about 1 minute and about 15 minutes, about 1 minute and about 5 minutes, about 5 minutes and about 240 minutes, about 5 minutes and about 90 minutes, about 5 minutes and about 60 minutes, about 5 minutes and about 30 minutes, about 5 minute and about 15 minutes, about 15 minutes and about 240 minutes, about 15 minutes and about 90 minutes, about 15 minutes and about 60 minutes, about 15 minutes and about 30 minutes, about 30 minutes and about 240 minutes, about 30 minutes and about 90 minutes, about 30 minutes and about 60 minutes, about 60 minutes and about 240 minutes, about 60 minutes and about 90 minutes, or about 90 minutes and about 240 minutes.

In some embodiments, the progress of the reaction is monitored by testing samples from the admixture or by in situ monitoring of the admixture using UV-vis spectroscopy. In some embodiments, after the admixture reaches the elevated temperature in (b), the temperature is maintained until the admixture shows an absorbance maximum by UV-vis spectroscopy of between about 350 nm and about 500 nm, about 350 nm and about 475 nm, about 350 nm and about 450 nm, about 350 nm and about 425 nm, about 350 nm and about 400 nm, about 350 nm and about 375 nm, about 375 nm and about 500 nm, about 375 nm and about 475 nm, about 375 nm and about 450 nm, about 375 nm and about 425 nm, about 375 nm and about 400 nm, about 400 nm and about 500 nm, about 400 nm and about 475 nm, about 400 nm and about 450 nm, about 400 nm and about 425 nm, about 425 nm and about 475 nm, about 425 nm and about 450 nm, about 450 nm and about 500 nm, about 450 nm and about 475 nm, or about 475 nm and about 500 nm. In some embodiments, after the admixture reaches the elevated temperature in (b), the temperature is maintained until a sample taken from the admixture shows an absorbance maximum by UV-vis spectroscopy of between about 425 nm and about 450 nm.

In some embodiments, additional shells are produced by further additions of shell material precursors that are added to the reaction mixture followed by maintaining at an elevated temperature. Typically, additional shell precursor is provided after reaction of the previous shell is substantially complete (e.g., when at least one of the previous precursors is depleted or removed from the reaction or when no additional growth is detectable). The further additions of precursor create additional shells.

In some embodiments, the nanostructure is cooled before the addition of additional shell material precursor to provide further shells. In some embodiments, the nanostructure is maintained at an elevated temperature before the addition of shell material precursor to provide further shells.

Production of InP/ZnSe Core Shell Nanostructures—Method B

In some embodiments, the present invention is directed to a method of producing a core/shell InP/ZnSe nanostructure comprising:
(a) admixing a zinc or selenium shell precursor and a solvent;
(b) raising, lowering, or maintaining the temperature of the admixture in (a) to a temperature between about 50° C. and about 250° C.; and
(c) adding an InP core and a zinc or selenium shell precursor to the admixture in (b);
to provide the InP/ZnSe nanostructure.

In some embodiments, a core/shell nanostructure is produced in the presence of a solvent. In some embodiments, the solvent is selected from the group consisting of 1-octadecene, 1-hexadecene, 1-eicosene, eicosane, octadecane, hexadecane, tetradecane, squalene, squalane, trioctylphosphine oxide, trioctylamine, trioctylphosphine, and dioctyl ether. In some embodiments, the solvent is 1-octadecene.

In some embodiments, the zinc/selenium shell precursor and solvent are admixed in (a) at a temperature between about 0° C. and about 150° C., about 0° C. and about 100° C., about 0° C. and about 50° C., about 0° C. and about 30° C., about 0° C. and about 20° C., about 20° C. and about 150° C., about 20° C. and about 100° C., about 20° C. and about 50° C., about 20° C. and about 30° C., about 30° C. and about 150° C., about 30° C. and about 100° C., about 30° C. and about 50° C., about 50° C. and about 150° C., about 50° C. and about 100° C., or about 100° C. and about 150° C. In some embodiments, the zinc/selenium shell source and solvent are admixed in (a) at a temperature between about 20° C. and about 30° C.

In some embodiments, the admixing in (a) further comprises at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the core synthesis and for the shell synthesis are the same. In some embodiments, the ligand(s) for the core synthesis and for the shell synthesis are different. Following synthesis, any ligand on the surface of the nanostructures can be exchanged for a different ligand with other desirable properties. Examples of ligands are disclosed in U.S. Pat. Nos. 7,572,395, 8,143,703, 8,425,803, 8,563,133, 8,916,064, 9,005,480, 9,139,770, and 9,169,435, and in U.S. Patent Application Publication No. 2008/0118755.

In some embodiments, the ligand admixed with the first shell precursor and solvent in (a) is a fatty acid selected from the group consisting of lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from the group consisting of dodecylamine, oleylamine, hexadecylamine, dioctylamine, and octadecylamine. In some embodiments, the ligand is lauric acid.

In some embodiments, the temperature of the admixture is raised, lowered, or maintained in (b) to a temperature between about 50° C. and about 250° C., about 50° C. and about 200° C., about 50° C. and about 150° C., about 50° C. and about 125° C., about 50° C. and about 100° C., about 50° C. and about 75° C., about 75° C. and about 250° C., about 75° C. and about 200° C., about 75° C. and about 150° C., about 75° C. and about 125° C., about 75° C. and about 100° C., about 100° C. and about 250° C., about 100° C. and about 200° C., about 100° C. and about 150° C., about 100° C. and about 125° C., about 125° C. and about 250° C., about 125° C. and about 200° C., about 125° C. and about 150° C., about 150° C. and about 250° C., about 150° C. and about 200° C., or about 200° C. and about 250° C. In some embodiments, the temperature of the admixture is raised, lowered, or maintained in (b) to a temperature between about 50° C. and about 150° C.

In some embodiments, the time for the temperature to reach the temperature in (b) is between about 2 minutes and about 240 minutes, about 2 minutes and about 200 minutes, about 2 minutes and about 100 minutes, about 2 minutes and about 60 minutes, about 2 minutes and about 40 minutes, about 5 minutes and about 240 minutes, about 5 minutes and about 200 minutes, about 5 minutes and about 100 minutes, about 5 minutes and about 60 minutes, about 5 minutes and about 40 minutes, about 10 minutes and about 240 minutes, about 10 minutes and about 200 minutes, about 10 minutes and about 100 minutes, about 10 minutes and about 60 minutes, about 10 minutes and about 40 minutes, about 40 minutes and about 240 minutes, about 40 minutes and about 200 minutes, about 40 minutes and about 100 minutes, about 40 minutes and about 60 minutes, about 60 minutes and about 240 minutes, about 60 minutes and about 200 minutes, about 60 minutes and about 100 minutes, about 100 minutes and about 240 minutes, about 100 minutes and about 200 minutes, or about 200 minutes and about 240 minutes.

In some embodiments, the temperature of the admixture in (c) is between about about 50° C. and about 250° C., about 50° C. and about 200° C., about 50° C. and about 150° C., about 50° C. and about 125° C., about 50° C. and about 100° C., about 50° C. and about 75° C., about 75° C. and about 250° C., about 75° C. and about 200° C., about 75° C. and about 150° C., about 75° C. and about 125° C., about 75° C. and about 100° C., about 100° C. and about 250° C., about 100° C. and about 200° C., about 100° C. and about 150° C., about 100° C. and about 125° C., about 125° C. and about 250° C., about 125° C. and about 200° C., about 125° C. and about 150° C., about 150° C. and about 250° C., about 150° C. and about 200° C., or about 200° C. and about 250° C. In some embodiments, the temperature of the admixture is elevated in (b) to a temperature between about 50° C. and about 150° C.

In some embodiments, the temperature is maintained in (c) for a time between about 2 minutes and about 240 minutes, about 2 minutes and about 200 minutes, about 2 minutes and about 100 minutes, about 2 minutes and about 60 minutes, about 2 minutes and about 40 minutes, about 5 minutes and about 240 minutes, about 5 minutes and about 200 minutes, about 5 minutes and about 100 minutes, about 5 minutes and about 60 minutes, about 5 minutes and about 40 minutes, about 10 minutes and about 240 minutes, about 10 minutes and about 200 minutes, about 10 minutes and about 100 minutes, about 10 minutes and about 60 minutes, about 10 minutes and about 40 minutes, about 40 minutes and about 240 minutes, about 40 minutes and about 200 minutes, about 40 minutes and about 100 minutes, about 40 minutes and about 60 minutes, about 60 minutes and about 240 minutes, about 60 minutes and about 200 minutes, about 60 minutes and about 100 minutes, about 100 minutes and about 240 minutes, about 100 minutes and about 200 minutes, or about 200 minutes and about 240 minutes.

In some embodiments, the progress of the reaction is monitored by testing samples from the admixture using UV-vis spectroscopy. In some embodiments, after addition of the nanostructure core in (c), the temperature is maintained until a sample taken from the admixture shows an absorbance maximum by UV-vis spectroscopy of between about 350 nm and about 500 nm, about 350 nm and about 475 nm, about 350 nm and about 450 nm, about 350 nm and about 425 nm, about 350 nm and about 400 nm, about 350 nm and about 375 nm, about 375 nm and about 500 nm, about 375 nm and about 475 nm, about 375 nm and about 450 nm, about 375 nm and about 425 nm, about 375 nm and about 400 nm, about 400 nm and about 500 nm, about 400 nm and about 475 nm, about 400 nm and about 450 nm, about 400 nm and about 425 nm, about 425 nm and about 475 nm, about 425 nm and about 450 nm, about 450 nm and about 500 nm, about 450 nm and about 475 nm, or about 475 nm and about 500 nm. In some embodiments, after addition of the nanostructure core in (c), the temperature is maintained until a sample taken from the admixture shows an absorbance maximum by UV-vis spectroscopy of between about 425 nm and about 450 nm.

In some embodiments, additional shells are produced by further additions of shell precursors that are added to the reaction mixture followed by maintaining at an elevated temperature. Typically, additional shell precursor is provided after reaction of the previous shell is substantially complete (e.g., when at least one of the previous precursors is depleted or removed from the reaction or when no additional growth is detectable). The further additions of precursor create additional shells.

In some embodiments, the nanostructure is cooled before the addition of additional shell precursor to provide further shells. In some embodiments, the nanostructure is maintained at an elevated temperature before the addition of shell precursor to provide further shells.

In some embodiments, the zinc source used to prepare at the shell layer is a dialkyl zinc compound. In some embodiments, the zinc source is a zinc carboxylate. In some embodiments, the zinc source is diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof. In some embodiments, the zinc source is zinc oleate, zinc hexanoate, zinc octanoate, zinc laurate, zinc myristate, zinc palmitate, zinc stearate, zinc dithiocarbamate, or mixtures thereof. In some embodiments, the zinc source is zinc oleate.

In some embodiments, the selenium source used to prepare at least one outer shell layer is an alkyl-substituted selenourea. In some embodiments, the selenium source is a phosphine selenide. In some embodiments, the selenium source is selected from trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, tricyclohexylphosphine selenide, cyclohexylphosphine selenide, 1-octaneselenol, 1-dodecaneselenol, selenophenol, elemental selenium, hydrogen selenide, bis(trimethylsilyl) selenide, selenourea, and mixtures thereof. In some embodiments, the selenium source is tri(n-butyl)phosphine selenide, tri(sec-butyl)phosphine selenide, or tri(tert-butyl)phosphine selenide. In some embodiments, the selenium source is trioctylphosphine selenide.

In some embodiments, each outer shell layer is synthesized in the presence of at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). Following synthesis, any ligand on the surface of the nanostructures can be exchanged for a different ligand with other desirable properties. Examples of ligands are disclosed in U.S. Pat. Nos. 7,572,395, 8,143,703, 8,425,803, 8,563,133, 8,916,064, 9,005,480, 9,139,770, and 9,169,435, and in U.S. Patent Application Publication No. 2008/0118755.

Ligands suitable for the synthesis of an outer shell layer are known by those of skill in the art. In some embodiments, the ligand is a fatty acid selected from the group consisting of lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from the group consisting of dodecylamine, oleylamine, hexadecylamine, dioctylamine, and octadecylamine. In some embodiments, the ligand is lauric acid.

After the ZnSe shell has been added to the InP nanostructure to reach the desired thickness and diameter, the nanostructure can be cooled. In some embodiments, the nanostructures are cooled to room temperature. In some embodiments, an organic solvent is added to dilute the reaction mixture comprising the nanostructures.

In some embodiments, the organic solvent used to dilute the reaction mixture comprising the nanostructures is ethanol, hexane, pentane, toluene, benzene, diethylether, acetone, ethyl acetate, dichloromethane (methylene chloride), chloroform, dimethylformamide, N-methylpyrrolidinone, or combinations thereof. In some embodiments, the organic solvent is toluene.

In some embodiments, nanostructures are isolated. In some embodiments, the nanostructures are isolated by precipitation using an organic solvent. In some embodiments, the nanostructures are isolated by flocculation with ethanol.

The size of the nanostructures can be determined using techniques known to those of skill in the art. In some embodiments, the size of the nanostructures is determined using TEM. In some embodiments, the nanostructures have an average diameter of between 1 nm and 15 nm, between 1 nm and 10 nm, between 1 nm and 9 nm, between 1 nm and 8 nm, between 1 nm and 7 nm, between 1 nm and 6 nm, between 1 nm and 5 nm, between 5 nm and 15 nm, between 5 nm and 10 nm, between 5 nm and 9 nm, between 5 nm and 8 nm, between 5 nm and 7 nm, between 5 nm and 6 nm, between 6 nm and 15 nm, between 6 nm and 10 nm, between 6 nm and 9 nm, between 6 nm and 8 nm, between 6 nm and 7 nm, between 7 nm and 15 nm, between 7 nm and 10 nm, between 7 nm and 9 nm, between 7 nm and 8 nm, between 8 nm and 15 nm, between 8 nm and 10 nm, between 8 nm and 9 nm, between 9 nm and 15 nm, between 9 nm and 10 nm, or between 10 nm and 15 nm. In some embodiments, the nanostructures have an average diameter of between 6 nm and 7 nm.

Production of an InP Core with ZnSe Shell—Method C

In some embodiments, the present invention is directed to a method of producing a core/shell InP/ZnSe nanostructure comprising:
  (a) adding InP cores to a solution comprising solvent, a ligand and a zinc chloride under an inert atmosphere at a temperature of about 80° C. to about 320° C.;
  (b) adding zinc bromide and gallium trichloride to the solution obtained in (a);
  (c) adding a selenium source to the solution obtained in (b);
  (d) heating the solution obtained in (c) to a temperature of about 250° C. to about 320° C.; and
  (e) allowing the solution obtained in (d) to cool.

In some embodiments, the solution in (a) is heated to a temperature of about 80° C. to 140° C., 90° C. to 140° C., 100° C. to 140° C., 110° C. to 140° C., 120° C. to 140° C., 130° C. to 140° C., 80° C. to 130° C., 90° C. to 130° C., 100° C. to 130° C., 110° C. to 130° C., 120° C. to 130° C., 80° C. to 110° C., 90° C. to 110° C., 100° C. to 110° C., or at about 100° C.

In some embodiments, the solvent is selected from the group consisting of 1-octadecene, 1-hexadecene, 1-eicosene, eicosane, octadecane, hexadecane, tetradecane, squalene, squalane, trioctylphosphine oxide, trioctylamine, trioctylphosphine, and dioctyl ether. In some embodiments, the solvent is 1-octadecene.

In some embodiments, the ligand added in (a) is a fatty acid selected from the group consisting of lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from the group consisting of dodecylamine, oleylamine, hexadecylamine, dioctylamine, and octadecylamine. In some embodiments, the ligand is lauric acid.

In some embodiments, the mole ratio of InP QDs to zinc chloride in (a) ranges from 1:0.5 to 1:4. In another embodiment, the mole ratio of InP QDs to zinc chloride is about 1:1.

In some embodiments, the mole ratio of InP QDs to zinc bromide in (b) ranges from 1:0.5 to 1:4. In another embodiment, the mole ratio of InP QDs to zinc bromide is about 1:0.6.

In some embodiments, the mole ratio of InP QDs to gallium trichloride in (b) ranges from 1:0.5 to 1:4. In another embodiment, the mole ratio of InP QDs to gallium trichloride is about 1:0.7.

In some embodiments, the selenium source is an alkyl selenide or powdered selenium.

In some embodiments, the temperature in (d) is increased to 200° C. to 300° C. In another embodiment, the temperature of the solution is increased to 210° C. to 300° C., 220° C. to 300° C., 230° C. to 300° C., 240° C. to 300° C., 250° C. to 300° C., 260° C. to 300° C., 270° C. to 300° C., 280° C. to 300° C., 290° C. to 300° C., 210° C. to 290° C., 220° C. to 290° C., 230° C. to 290° C., 240° C. to 290° C., 250° C. to 290° C., 260° C. to 290° C., 270° C. to 290° C., 280° C. to 290° C., 210° C. to 280° C., 220° C. to 280° C., 230° C. to 280° C., 240° C. to 280° C., 250° C. to 280° C., 260° C. to 280° C., 270° C. to 280° C., 210° C. to 270° C., 220° C. to 270° C., 230° C. to 270° C., 240° C. to 270° C., 250° C. to 270° C., 260° C. to 270° C., 210° C. to 260° C., 220° C. to 260° C., 230° C. to 260° C., 240° C. to 260° C., or at about 250° C. The increased temperature is held for about 5 minutes to about 5 hours. In another embodiment, the increased temperature is held for 5, 10, 20, 30, 40, 50, 60, 70, 80, 90, 100, 110, 120, 130, 140, 150, 160, 170, 180, 190, 200, 210, 220, 230, 240, 250, 260, 280, 290, 300, or about 120 minutes.

Nanostructure Properties

In some embodiments, the nanostructures display a high photoluminescence quantum yield. In some embodiments, the nanostructures display a photoluminescence quantum yield of between about 60% and about 99%, about 60% and about 95%, about 60% and about 90%, about 60% and about 85%, about 60% and about 80%, about 60% and about 70%, about 70% and about 99%, about 70% and about 95%, about 70% and about 90%, about 70% and about 85%, about 70% and about 80%, about 80% and about 99%, about 80% and about 95%, about 80% and about 90%, about 80% and about 85%, about 85% and about 99%, about 85% and about 95%, about 80% and about 85%, about 85% and about 99%, about 85% and about 90%, about 90% and about 99%, about 90% and about 95%, or about 95% and about 99%. In some embodiments, the nanostructures display a photoluminescence quantum yield of between about 85% and about 90%. In one embodiment, the core-shell nanostructures are InP/ZnSe.

The photoluminescence spectrum of the nanostructures can cover essentially any desired portion of the spectrum. In some embodiments, the photoluminescence spectrum for the nanostructures have a emission maximum between 300 nm and 750 nm, 300 nm and 650 nm, 300 nm and 550 nm, 300 nm and 450 nm, 450 nm and 750 nm, 450 nm and 650 nm, 450 nm and 550 nm, 450 nm and 750 nm, 450 nm and 650 nm, 450 nm and 550 nm, 550 nm and 750 nm, 550 nm and 650 nm, or 650 nm and 750 nm. In some embodiments, the photoluminescence spectrum for the nanostructures has an emission maximum of between 450 nm and 550 nm. In some embodiments, the the photoluminescence spectrum for the nanostructures has an emission maximum of between 530 nm and 540 nm. In one embodiment, the core-shell nanostructures are InP/ZnSe.

The size distribution of the nanostructures can be relatively narrow. In some embodiments, the photoluminescence spectrum of the population of nanostructures can have a full width at half maximum of between 10 nm and 60 nm, 10 nm and 40 nm, 10 nm and 30 nm, 10 nm and 20 nm, 20 nm and 60 nm, 20 nm and 40 nm, 20 nm and 30 nm, 30 nm and 60 nm, 30 nm and 40 nm, or 40 nm and 60 nm. In some embodiments, the photoluminescence spectrum of the population of nanostructures can have a full width at half maximum of between 35 nm and 50 nm. In one embodiment, the core-shell nanostructures are InP/ZnSe.

Surface Treatment of the Nanostructures

The nanostructures are subjected to a surface treatment that unexpectedly leads to improved EQE and lifetime when used in a device. The surface treatment comprises treating with a solution comprising a zinc carboxylate and a zinc halide at elevated temperature under an inert atomsphere. In some embodiments, the zinc carboxylate is zinc acetate. In some embodiments, the zinc halide is zinc fluoride. In one embodiment, the zinc acetate is in the form of a dihydrate. In one embodiment, the core-shell nanostructures are InP/ZnSe.

The mole ratio of zinc acetate to zinc fluoride may range from 1-5. In some embodiments, the mole ratio of zinc acetate to zinc fluoride may range from 2-5, 3-5, 4-5, 2-4, 3-5, 4-5, 2-4, or 2-3. In one embodiment, the mole ratio of zinc acetate to zinc fluoride is about 2:3. In one embodiment, the mole ratio of zinc acetate to InP cores is 4:1 to 35:1. In another embodiment, the mole ratio of zinc fluoride to InP cores is 1:9 to 1:40. In another embodiment, the mole ratios of zinc acetate, zinc fluoride and InP cores is about 20:28:1.

In some embodiments, to a solution comprising InP nanocrystals is added zinc acetate dihydrate and zinc fluoride. The temperature of addition may range from 0° C. to 100° C. In another embodiment, the temperature of the solution at the time of addition may range from 10° C. to 100° C., 20° C. to 100° C., 30° C. to 100° C., 40° C. to 100° C., 50° C. to 100° C., 60° C. to 100° C., 70° C. to 100° C., 80° C. to 100° C., 90° C. to 100° C., 0° C. to 90° C., 10° C. to 90° C., 20° C. to 90° C., 30° C. to 90° C., 40° C. to 90° C., 50° C. to 90° C., 60° C. to 90° C., 70° C. to 90° C., 80° C. to 90° C., 0° C. to 80° C., 10° C. to 80° C., 20° C. to 80° C., 30° C. to 80° C., 40° C. to 80° C., 50° C. to 80° C., 60° C. to 80° C., 70° C. to 80° C., 0° C. to 70° C., 10° C. to 70° C., 20° C. to 70° C., 30° C. to 70° C., 40° C. to 70° C., 50° C. to 70° C., 60° C. to 70° C., 0° C. to 60° C., 10° C. to 60° C., 20° C. to 60° C., 30° C. to 60° C., 40° C. to 60° C., 50° C. to 60° C., 0° C. to 50° C., 10° C. to 50° C., 20° C. to 50° C., 30° C. to 50° C., 40° C. to 50° C., 0° C. to 40° C., 10° C. to 40° C., 20° C. to 40° C., 30° C. to 40° C., 0° C. to 30° C., 10° C. to 30° C., 20° C. to 30° C., 0° C. to 20° C., 10° C. to 20° C., or room temperature.

The reaction temperature is then increased to 200° C. to 300° C. In another embodiment, the temperature of the solution is increased to 210° C. to 300° C., 220° C. to 300° C., 230° C. to 300° C., 240° C. to 300° C., 250° C. to 300° C., 260° C. to 300° C., 270° C. to 300° C., 280° C. to 300° C., 290° C. to 300° C., 200° C. to 290° C., 210° C. to 290° C., 220° C. to 290° C., 230° C. to 290° C., 240° C. to 290° C., 250° C. to 290° C., 260° C. to 290° C., 270° C. to 290° C., 280° C. to 290° C., 200° C. to 280° C., 210° C. to 280° C., 220° C. to 280° C., 230° C. to 280° C., 240° C. to 280° C., 250° C. to 280° C., 260° C. to 280° C., 270° C. to 280° C., 200° C. to 270° C., 210° C. to 270° C., 220° C. to 270°

C., 230° C. to 270° C., 240° C. to 270° C., 250° C. to 270° C., 260° C. to 270° C., 200° C. to 260° C., 210° C. to 260° C., 220° C. to 260° C., 230° C. to 260° C., 240° C. to 260° C., 250° C. to 260° C., 200° C. to 250° C., 210° C. to 250° C., 220° C. to 250° C., 230° C. to 250° C., 240° C. to 250° C., or to about 250° C. The increased temperature is held for 1-5 hours. In another embodiment, the increased temperature is held for 60, 70, 80, 90, 100, 110, 120, 130, 140, 150, 160, 170, 180, 190, 200, 210, 220, 230, 240, 250, 260, 280, 290, 300, or about 120 minutes.

The reaction is then allowed to cool to 50° C. to 150° C. In another embodiment, the reaction is allowed to cool to 50° C. to 140° C., 60° C. to 140° C., 70° C. to 140° C., 80° C. to 140° C., 90° C. to 140° C., 100° C. to 140° C., 110° C. to 140° C., 120° C. to 140° C., 130° C. to 140° C., 50° C. to 130° C., 60° C. to 130° C., 70° C. to 130° C., 80° C. to 130° C., 90° C. to 130° C., 100° C. to 130° C., 110° C. to 130° C., 120° C. to 130° C., 50° C. to 120° C., 60° C. to 120° C., 70° C. to 120° C., 80° C. to 120° C., 90° C. to 120° C., 100° C. to 120° C., 110° C. to 120° C., or to about 100° C.

After the reaction has cooled, a ligand is added. In some embodiments, TOP is added. The core-shell nanostructures with zinc acetate and zinc fluoride on their surface may then be isolated by any method known for isolating nanostructures. In one embodiment, the core-shell nanostructures are isolated by precipitation and/or centrifugation, and washed with a solvent. In one embodiment, the core-shell nanostructures are precipitated by addition of an alcohol, such as ethanol, and hexane. In one embodiment, the core-shell nanostructures are InP/ZnSe.

Peak Emission Wavelength

In some embodiments, the core-shell nanostructures emit light having a peak emission wavelength (PWL) between about 400 nm and about 650 nm, about 400 nm and about 600 nm, about 400 nm and about 550 nm, about 400 nm and about 500 nm, about 400 nm and about 450 nm, about 450 nm and about 650 nm, about 450 nm and about 600 nm, about 450 nm and about 550 nm, about 450 nm and about 500 nm, about 500 nm and about 650 nm, about 500 nm and about 600 nm, about 500 nm and about 550 nm, about 550 nm and about 650 nm, about 550 nm and about 600 nm, or about 600 nm and about 650 nm. In some embodiments, the nanostructures emit light having a PWL between about 500 nm and about 550 nm. In some embodiments, the nanostructures emit light having a PWL between about 530 nm and about 540 nm. In one embodiment, the core-shell nanostructures are InP/ZnSe.

Films, Devices and Uses

A population of the core-shell nanostructures are optionally embedded in a matrix that forms a film (e.g., an organic polymer, silicon-containing polymer, inorganic, glassy, and/or other matrix). This film may be used in production of a nanostructure phosphor, and/or incorporated into a device, e.g., an LED, backlight, downlight, or other display or lighting unit or an optical filter. Exemplary phosphors and lighting units can, e.g., generate a specific color light by incorporating a population of nanostructures with an emission maximum at or near the desired wavelength or a wide color gamut by incorporating two or more different populations of nanostructures having different emission maxima. A variety of suitable matrices are known in the art. See, e.g., U.S. Pat. No. 7,068,898 and U.S. Patent Application Publication Nos. 2010/0276638, 2007/0034833, and 2012/0113672. Exemplary nanostructure phosphor films, LEDs, backlighting units, etc. are described, e.g., in U.S. Patent Application Publications Nos. 2010/0276638, 2012/0113672, 2008/0237540, 2010/0110728, and 2010/0155749 and U.S. Pat. Nos. 7,374,807, 7,645,397, 6,501,091, and 6,803,719. In one embodiment, the core-shell nanostructures are InP/ZnSe.

In some embodiments, the nanostructure films are used to form display devices. As used herein, a display device refers to any system with a lighting display. Such devices include, but are not limited to, devices encompassing a liquid crystal display (LCD), televisions, computers, mobile phones, smart phones, personal digital assistants (PDAs), gaming devices, electronic reading devices, digital cameras, and the like.

In some embodiments, the present disclosure provides a nanostructure molded article comprising:
  (a) a first conductive layer;
  (b) a second conductive layer; and
  (c) a nanostructure layer between the first conductive layer and the second conductive layer, wherein the nanostructure layer comprises a population of nanostructures comprising a nanocrystal core and at least one shell with zinc acetate and zinc fluoride bound to its surface. In some embodiments, the core-shell nanostructures are InP/ZnSe.

In some embodiments, the present disclosure provides a nanostructure film comprising:
  (a) at least one population of nanostructures, the nanostructures comprising a core and at least one shell with a zinc carboxylate and zinc halide bound to its surface; and
  (b) at least one organic resin.

In some embodiments, the core-shell nanostructures are InP/ZnSe.

In some embodiments, the core/shell(s) nanostructures are embedded in a matrix. As used herein, the term "embedded" is used to indicate that the nanostructures are enclosed or encased within a matrix material that makes up the majority component of the matrix. In some embodiments, the nanostructures are uniformly distributed throughout the matrix material. In some embodiments, the nanostructures are distributed according to an application-specific uniformity distribution function.

The matrix material can be any suitable host matrix material capable of housing nanostructures. Suitable matrix materials can be chemically and optically compatible with nanostructures and any surrounding packaging materials or layers used in applying a nanostructure film to devices. Suitable matrix materials can include non-yellowing optical materials that are transparent to both the primary and secondary light, thereby allowing for both primary and secondary light to transmit through the matrix material. Matrix materials can include polymers and organic and inorganic oxides. Suitable polymers for use in the matrix material can be any polymer known to the ordinarily skilled artisan that can be used for such a purpose. The polymer can be substantially translucent or substantially transparent. Matrix materials can include, but not limited to, epoxies, acrylates, norbornene, polyethylene, poly(vinyl butyral): poly(vinyl acetate), polyurea, polyurethanes; silicones and silicone derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; acrylic polymers and copolymers formed from monomers including, but not limited to, methylmethacrylate, butylmethacrylate, and laurylmethacrylate; styrene-based polymers such as polystyrene, amino polystyrene (APS), and poly(acrylonitrile ethylene styrene)

(AES); polymers that are cross-linked with bifunctional monomers, such as divinylbenzene; cross-linkers suitable for cross-linking ligand materials, epoxides that combine with ligand amines (e.g., APS or polyethylene imine ligand amines) to form epoxy, and the like.

In some embodiments, the matrix material includes scattering microbeads such as $TiO_2$ microbeads, ZnS microbeads, or glass microbeads that can improve photo conversion efficiency of the nanostructure film. In some embodiments, the matrix material can include light blocking elements.

In some embodiments, the matrix material can have low oxygen and moisture permeability, exhibit high photo- and chemical-stability, exhibit favorable refractive indices, and adhere to outer surfaces of the nanostructures, thus providing an air-tight seal to protect the nanostructures. In another embodiment, the matrix material can be curable with UV or thermal curing methods to facilitate roll-to-roll processing.

In some embodiments, a nanostructure film can be formed by mixing nanostructures in a polymer (e.g., photoresist) and casting the nanostructure-polymer mixture on a substrate, mixing the nanostructures with monomers and polymerizing them together, mixing nanostructures in a sol-gel to form an oxide, or any other method known to those skilled in the art.

In some embodiments, the formation of a nanostructure film can include a film extrusion process. The film extrusion process can include forming a homogenous mixture of matrix material and core-shell nanostructures, introducing the homogenous mixture into a top mounted hopper that feeds into an extruder. In some embodiments, the homogenous mixture can be in the form of pellets. The film extrusion process can further include extruding a nanostructure film from a slot die and passing an extruded nanostructure film through chill rolls. In some embodiments, the extruded nanostructure film can have a thickness less than about 75 µm, for example, in a range from about 70 µm to about 40 µm, about 65 µm to about 40 µm, about 60 µm to about 40 µm, or about 50 µm to about 40 µm. In some embodiments, the nanostructure film has a thickness less than about 10 µm. In some embodiments, the formation of the nanostructure film can optionally include a secondary process followed by the film extrusion process. The secondary process can include a process such as co-extrusion, thermoforming, vacuum forming, plasma treatment, molding, and/or embossing to provide a texture to a top surface of the nanostructure film layer. The textured top surface nanostructure film can help to improve, for example defined optical diffusion property and/or defined angular optical emission property of the nanostructure film.

In some embodiments, the nanostructure composition is used to form a nanostructure molded article. In some embodiments, the nanostructure molded article is a liquid crystal display (LCD) or a light emitting diode (LED). In some embodiments, the nanostructure composition is used to form the emitting layer of an illumination device. The illumination device can be used in a wide variety of applications, such as flexible electronics, touchscreens, monitors, televisions, cellphones, and any other high definition displays. In some embodiments, the illumination device is a light emitting diode or a liquid crystal display. In some embodiments, the illumination device is a quantum dot light emitting diode (QLED). An example of a QLED is disclosed in U.S. patent application Ser. No. 15/824,701, which is incorporated herein by reference in its entirety. In some embodiments, the core-shell nanostructures are InP/ZnSe.

In some embodiments, the present disclosure provides a light emitting diode comprising:
(a) a first conductive layer;
(b) a second conductive layer; and
(c) an emitting layer between the first conductive layer and the second conductive layer, wherein the emitting layer comprises (i) at least one population of nanostructures comprising a nanocrystal core and zinc acetate and zinc fluoride bound to their surface.

In some embodiments, the core-shell nanostructures are InP/ZnSe.

In some embodiments, the emitting layer is a nanostructure film.

In some embodiments, the light emitting diode comprises a first conductive layer, a second conductive layer, and an emitting layer, wherein the emitting layer is arranged between the first conductive layer and the second conductive layer. In some embodiments, the emitting layer is a thin film.

In some embodiments, the light emitting diode comprises additional layers between the first conductive layer and the second conductive layer such as a hole injection layer, a hole transport layer, and an electron transport layer. In some embodiments, the hole injection layer, the hole transport layer, and the electron transport layer are thin films. In some embodiments, the layers are stacked on a substrate.

When voltage is applied to the first conductive layer and the second conductive layer, holes injected at the first conductive layer move to the emitting layer via the hole injection layer and/or the hole transport layer, and electrons injected from the second conductive layer move to the emitting layer via the electron transport layer. The holes and electrons recombine in the emitting layer to generate excitons. In some embodiments, the hole transport layer comprises poly[(9,9-dioctylfluorenyl-2,7-diyl)-co-(4,4'-(N-(4-sec-butylphenyl)diphenylamine)] (TFB).

In some embodiments, the nanostructure film is incorporated into a quantum dot on glass LCD display device. A LCD display device can include a nanostructure film formed directly on a light guide plate (LGP) without necessitating an intermediate substrate or barrier layer. In some embodiments, a nanostructure film can be a thin film. In some embodiments, a nanostructure film can have a thickness of 500 µm or less, 100 µm or less, or 50 µm or less. In some embodiments, a nanostructure film is a thin film having a thickness of about 15 µm or less. In some embodiments, the core-shell nanostructures are InP/ZnSe.

A LGP can include an optical cavity having one or more sides, including at least a top side, comprising glass. Glass provides excellent resistance to impurities including moisture and air. Moreover, glass can be formed as a thin substrate while maintaining structural rigidity. Therefore, a LGP can be formed at least partially of a glass surface to provide a substrate having sufficient barrier and structural properties.

In some embodiments, a nanostructure film can be formed on a LGP. In some embodiments, the nanostructure film comprises a population of nanostructures embedded in a matrix material, such as a resin. A nanostructure film can be formed on a LGP by any method known in the art, such as wet coating, painting, spin coating, or screen printing. After deposition, a resin of a nanostructure film can be cured. In some embodiments a resin of one or more nanostructure films can be partially cured, further processed and then finally cured. The nanostructure films can be deposited as one layer or as separate layers, and the separate layers can comprise varying properties. The width and height of the nanostructure films can be any desired dimensions, depending on the size of the viewing panel of the display device. For example, the nanostructure films can have a relatively small surface area in small display device embodiments such as watches and phones, or the nanostructure films can have a large surface area for large display device embodiments such as TVs and computer monitors.

In some embodiments, an optically transparent substrate is formed on a nanostructure film by any method known in the art, such as vacuum deposition, vapor deposition, or the like. An optically transparent substrate can be configured to provide environmental sealing to the underlying layers and/or structures of the nanostructure film. In some embodiments, light blocking elements can be included in the optically transparent substrate. In some embodiments, light blocking elements can be included in a second polarizing filter, which can be positioned between the substrate and the nanostructure film. In some embodiments, light blocking elements can be dichroic filters that, for example, can reflect the primary light (e.g., blue light, UV light, or combination of UV light and blue light) while transmitting the secondary light. Light blocking elements can include specific UV light filtering components to remove any unconverted UV light from the red and green sub-pixels, and/or the UV light from the blue sub-pixels.

In some embodiments, the nanostructures are incorporated into display devices by "on-chip" placements. As used herein, "on-chip" refers to placing nanostructures into an LED cup. In some embodiments, the nanostructures are dissolved in a resin or a fluid to fill the LED cup.

In some embodiments, the nanostructures are incorporated into display devices by "near-chip" placements. As used herein, "near-chip" refers to coating the top surface of the LED assembly with nanostructures such that the outgoing light passes through the nanostructure film.

In some embodiments, the present invention provides a display device comprising:
  (a) a display panel to emit a first light;
  (b) a backlight unit configured to provide the first light to the display panel; and
  (c) a color filter comprising at least one pixel region comprising a color conversion layer.

In some embodiments, the color filter comprises at least 1, 2, 3, 4, 5, 6, 7, 8, 9, or 10 pixel regions. In some embodiments, when blue light is incident on the color filter, red light, white light, green light, and/or blue light may be respectively emitted through the pixel regions. In some embodiments, the color filter is described in U.S. Patent Appl. Publication No. 2017/153366, which is incorporated herein by reference in its entirety.

In some embodiments, each pixel region includes a color conversion layer. In some embodiments, a color conversion layer comprises nanostructures described herein configured to convert incident light into light of a first color. In some embodiments, the color conversion layer comprises nanostructures described herein configured to convert incident light into blue light.

In some embodiments, the display device comprises 1, 2, 3, 4, 5, 6, 7, 8, 9, or 10 color conversion layers. In some embodiments, the display device comprises 1 color conversion layer comprising the nanostructures described herein. In some embodiments, the display device comprises 2 color conversion layers comprising the nanostructures described herein. In some embodiments, the display device comprises 3 color conversion layers comprising the nanostructures described herein. In some embodiments, the display device comprises 4 color conversion layers comprising the nanostructures described herein. In some embodiments, the display device comprises at least one red color conversion layer, at least one green color conversion layer, and at least one blue color conversion layer.

In some embodiments, the color conversion layer has a thickness between about 3 µm and about 10 µm, about 3 µm and about 8 µm, about 3 µm and about 6 µm, about 6 µm and about 10 µm, about 6 µm and about 8 µm, or about 8 µm and about 10 µm. In some embodiments, the color conversion layer has a thickness between about 3 µm and about 10 µm.

The nanostructure color conversion layer can be deposited by any suitable method known in the art, including but not limited to painting, spray coating, solvent spraying, wet coating, adhesive coating, spin coating, tape-coating, roll coating, flow coating, inkjet printing, photoresist patterning, drop casting, blade coating, mist deposition, or a combination thereof. In some embodiments, the nanostructure color conversion layer is deposited by photoresist patterning. In some embodiments, nanostructure color conversion layer is deposited by inkjet printing.

The core-shell nanostructures can be used for imaging or labeling, e.g., biological imaging or labeling. Thus, the resulting nanostructures are optionally covalently or noncovalently bound to biomolecule(s), including, but not limited to, a peptide or protein (e.g., an antibody or antibody domain, avidin, streptavidin, neutravidin, or other binding or recognition molecule), a ligand (e.g., biotin), a polynucleotide (e.g., a short oligonucleotide or longer nucleic acid), a carbohydrate, or a lipid (e.g., a phospholipid or other micelle). One or more nanostructures can be bound to each biomolecule, as desired for a given application. Such nanostructure-labeled biomolecules find use, for example, in vitro, in vivo, and in cellulo, e.g., in exploration of binding or chemical reactions as well as in subcellular, cellular, and organismal labeling. In one embodiment, the core-shell nanostructures are InP/ZnSe.

The core-shell nanostructures resulting from the methods are also a feature of the invention. Thus, one class of embodiments provides a population of core-shell nanostructures. In some embodiments, the nanostructures are quantum dots. In one embodiment, the core-shell nanostructures are InP/ZnSe.

Inkjet Printing

The formation of thin films using dispersions of nanostructures in organic solvents is often achieved by coating techniques such as spin coating. However, these coating techniques are generally not suitable for the formation of thin films over a large area and do not provide a means to pattern the deposited layer and thus, are of limited use. Inkjet printing allows for precisely patterned placement of thin films on a large scale at low cost. Inkjet printing also allows for precise patterning of nanostructure layers, allows printing pixels of a display, and eliminates photopatterning. Thus, inkjet printing is very attractive for industrial application particularly in display applications.

Solvents commonly used for inkjet printing are dipropylene glycol monomethyl ether acetate (DPMA), polyglycidyl methacrylate (PGMA), diethylene glycol monoethyl ether acetate (EDGAC), and propylene glycol methyl ether acetate (PGMEA). Volatile solvents are also frequently used in inkjet printing because they allow rapid drying. Volatile solvents include ethanol, methanol, 1-propanol, 2-propanol, acetone, methyl ethyl ketone, methyl isobutyl ketone, ethyl acetate, and tetrahydrofuran. Conventional nanostructures generally cannot be dissolved in these solvents. However, the increased hydrophilicity of the nanostructures comprising poly(alkylene oxide) ligands allows for increased solubility in these solvents.

In some embodiments, the nanostructures described herein used for inkjet printing are dispersed in a solvent selected from DPMA, PGMA, EDGAC, PGMEA, ethanol, methanol, 1-propanol, 2-propanol, acetone, methyl ethyl ketone, methyl isobutyl ketone, ethyl acetate, tetrahydrofuran, chloroform, chlorobenzene, cyclohexane, hexane, heptane, octane, hexadecane, undecane, decane, dodecane, xylene, toluene, benzene, octadecane, tetradecane, butyl ether, or combinations thereof. In some embodiments, the nanostructures comprising a poly(alkylene oxide) ligands described herein used for inkjet printing are dispersed in a solvent selected from DPMA, PGMA, EDGAC, PGMEA, ethanol, methanol, 1-propanol, 2-propanol, acetone, methyl ethyl ketone, methyl isobutyl ketone, ethyl acetate, tetrahydrofuran, or combinations thereof.

In order to be applied by inkjet printing or microdispensing, the inkjet compositions comprising nanostructures should be dissolved in a suitable solvent. The solvent must be able to disperse the nanostructure composition and must not have any detrimental effect on the chosen print head.

In some embodiments, the inkjet composition further comprises one or more additional components such as surface-active compounds, lubricating agents, wetting agents, dispersing agents, hydrophobing agents, adhesive agents, flow improvers, defoaming agents, deaerators, diluents, auxiliaries, colorants, dyes, pigments, sensitizers, stabilizers, and inhibitors.

In some embodiments, the nanostructure compositions described herein comprise by weight of the inkjet composition between about 0.01% and about 20%. In some embodiments, the nanostructures comprising poly(alkylene oxide) ligands comprise by weight of the inkjet composition between about 0.01% and about 20%, about 0.01% and about 15%, about 0.01% and about 10%, about 0.01% and about 5%, about 0.01% and about 2%, about 0.01% and about 1%, about 0.01% and about 0.1%, about 0.01% and about 0.05%, about 0.05% and about 20%, about 0.05% and about 15%, about 0.05% and about 10%, about 0.05% and about 5%, about 0.05% and about 2%, about 0.05% and about 1%, about 0.05% and about 0.1%, about 0.1% and about 20%, about 0.1% and about 15%, about 0.1% and about 10%, about 0.1% and about 5%, about 0.1% and about 2%, about 0.1% and about 1%, about 0.5% and about 20%, about 0.5% and about 15%, about 0.5% and about 10%, about 0.5% and about 5%, about 0.5% and about 2%, about 0.5% and about 1%, about 1% and about 20%, about 1% and about 15%, about 1% and about 10%, about 1% and about 5%, about 1% and about 2%, about 2% and about 20%, about 2% and about 15%, about 2% and about 10%, about 2% and about 5%, about 5% and about 20%, about 5% and about 15%, about 5% and about 10%, about 10% and about 20%, about 10% and about 15%, or about 15% and 20%.

In some embodiments, the inkjet composition comprising a nanostructure or a nanostructure composition described herein is used in the formulation of an electronic device. In some embodiments, the inkjet composition comprising a nanostructure or a nanostructure composition described herein is used in the formulation of an electronic device selected from the group consisting of a nanostructure film, a display device, a lighting device, a backlight unit, a color filter, a surface light-emitting device, an electrode, a magnetic memory device, and a battery. In some embodiments, the inkjet composition comprising a nanostructure composition described herein is used in the formulation of a light-emitting device.

EXAMPLES

The following examples are illustrative and non-limiting, of the products and methods described herein. Suitable modifications and adaptations of the variety of conditions, formulations, and other parameters normally encountered in the field and which are obvious to those skilled in the art in view of this disclosure are within the spirit and scope of the invention.

Example 1

Preparation of an InP/ZnSe Green Emitting Nanostructures

The following process was used to prepare InP/ZnSe green emitting nanostructures.

Weigh out 28.2895 grams of zinc oleate and 8.0631 grams of lauric acid.

Add the zinc oleate and lauric acid to a 3 neck round bottom flask and add 79.65 mL of 1-octadecene (ODE) and a stir bar to the flask.

Outfit the flask with a rubber septum, a thermocouple adapter with a thermocouple, and a Schlenk adapter and connect the flask to the Schlenk line.

Carefully degas the solution at room temperature with vigorous stirring.

Place the flask under nitrogen flow from the Schlenk line.

Lower the flask into a heating mantle and heat the solution to about 90° C. under nitrogen flow.

After obtaining a clear, colorless solution, carefully evacuate the flask with vigorous stirring for a couple of minutes.

Place the flask under nitrogen flow and heat up the solution to 110° C.

As the solution reaches 110° C., add 150 mg of zinc chloride that had been weighed out into a vial from a glovebox.

Once the solution temperature stabilizes at 110° C., add 4.13 mL of InP cores (150 mg corresponding to 1.02 mmol InP cores) and allow the cores to etch in the solution for 10 minutes.

After ten minutes, remove the rubber septum and quickly add 150 mg of $ZnBr_2$ and 300 mg of $GaCl_3$ that had been weighed out in a glovebox and quickly return the rubber septum.

Inject 1.73 mL of 1.92 M TOPSe in TOP through the rubber septum and heat up the solution to 270° C.

As soon as the temperature reaches 270° C., use the syringe pump to deliver 325.94 mg Se powder with 20 ml ODE.

Raise the temperature to 310° C. and hold at that temperature for 20 minutes.

After 20 minutes, turn off the heat from the temperature controller and remove the heating mantle from underneath the flask and allow the flask to cool.

Example 2

Surface Treatment of InP/ZnSe Green Emitting Nanostructures.

After the reaction mixture obtained in Example 1 has cooled to room temperature, the rubber septum was quickly removed and 4.36 grams of zinc acetate dihydrate and 3 grams of zinc fluoride were added to the flask. The rubber septum was quickly replaced.

The flask was placed back into the heating mantle and heated to 250° C. This temperature was held for 2 hours.

After 2 hours, the flask was allowed to cool to 100° C.

Once the flask has cooled to about 100° C., 34 mL of TOP was added from syringes prepared in the glovebox.

The flask was then carefully evacuated, the flask was sealed with a Schlenk adapter, and the flask was transferred to the glovebox along with a couple of Teflon bottles.

Undissolved material was precipitated at room temperature by centrifugation at 5000 rpm for 30 min. To the clear solution, hexane and EtOH were added and the suspension was centrifuged at 4000 rpm for 15 min. This was repeated three times to provide purified surface treated InP/ZnSe nanostructures.

Example 3

Characterization of Surface Treated InP/ZnSe Green Emitting Nanostructures.

A QLED device was prepared for testing the surface treated core/shell nanostructions. The device consisted of an ITO-coated glass substrate, a hole injection layer (HIL) containing PEDOT-PSS, a hole transport layer, a nanostructure layer in anhydrous octane, a ETL layer (ZnMgO), and a cathode layer (aluminum). Table 1 shows the results of testing devices containing InP/ZnSe/ZnS, InP/ZnSe, InP/ZnSe with surface treatment condition 1, and InP/ZnSe with surface treatment condition 2 in the nanostructure layer.

TABLE 1

| QDs | PL/nm | FWHM/nm | QY/% | Max EQE | EQE@10J | LT95 | LT50 |
| --- | --- | --- | --- | --- | --- | --- | --- |
| InP/ZnSe/ZnS | 529.5 | 36.4 | 90.8 | 10.90% | 5.40% | 4.67 s | 326 s |
| InP/ZnSe | 559.4 | 53.8 | 58.5 | 3.00% | 1.70% | 0.35 s | 7.27 s |
| InP/ZnSe Treat Condi. 1 | 529.8 | 37.9 | 85.1 | 7.80% | 6.60% | 367 s | 3.9 hr |
| InP/ZnSe Treat Condi. 2 | 538.1 | 39.3 | 88.2 | 13% | 9.30% | 36 s | 1.44 hr |

Treat Condi. 1 is treatment with zinc fluoride and zinc acetate for 2 hr.
Treat Condi. 2 is treatment with zinc fluoride and zinc acetate for 10 hr.

As can been seen in Table 1, the QYs of InP/ZnSe core-shell nanostructures and FWHM were 58.5% and 53.8 nm, which were lower than those observed for InP/ZnSe/ZnS core-shell nanostructures at 90.8% and 36.4 nm, respectively. However, the QY recovered to 85.1% and the FWHM narrowed to 37.9 nm for the InP/ZnSe core-shell nanostructures after surface treatment with zinc acetate dihydrate and zinc fluoride for 2 hours. Extending the surface treatment to 10 hr (Treat Condi. 2) resulted in an increase in the QY to 88.2% and a narrowing of the FWHM to 39.3 nm.

While various embodiments have been described above, it should be understood that they have been presented by way of example only, and not limitation. It will be apparent to persons skilled in the relevant art that various changes in form and detail can be made therein without departing from the spirit and scope of the invention. Thus, the breadth and scope should not be limited by any of the above-described exemplary embodiments, but should be defined only in accordance with the following claims and their equivalents.

All publications, patents and patent applications mentioned in this specification are indicative of the level of skill of those skilled in the art to which this invention pertains, and are herein incorporated by reference to the same extent as if each individual publication, patent or patent application was specifically and individually indicated to be incorporated by reference.

What is claimed is:

1. A population of nanostructures comprising a nanocrystal core, wherein the nanocrystal core comprises InP, and at least one shell, wherein the at least one shell is ZnSe, and wherein the nanostructures comprise a zinc carboxylate and a zinc halide bound to their surfaces, wherein the population of nanostructures has a full width at half maximum (FWHM) of between 10 nm and 40 nm.

2. The nanostructures of claim 1, wherein the nanostructures have a diameter of about 4-12 nm.

3. The nanostructures of claim 1, wherein the population of nanostructures has a FWHM of 38-39 nm.

4. The nanostructures of claim 1, wherein the population of nanostructures has a quantum yield (QY %) of 85-88%.

5. The nanostructures of claim 1, wherein the zinc carboxylate is zinc acetate or zinc acetate dihydrate.

6. The nanostructures of claim 1, wherein the zinc halide is zinc fluoride.

7. A method of making the nanostructures of claim 1, comprising:
   (a) admixing core-shell nanostructures in a solvent with a zinc carboxylate and zinc halide under an inert atmosphere, wherein the nanostructures are InP/ZnSe core-shell nanostructures;
   (b) raising the temperature of the admixture in (a) to a temperature between about 90° C. and about 350° C.; and
   (c) isolating the core-shell nanocrystals with zinc acetate and zinc fluoride bound to their surfaces.

8. The method of claim 7, wherein the zinc carboxylate is zinc acetate or zinc acetate dihydrate.

9. The method of claim 7, wherein the InP/ZnSe core/shell nanocrystals are obtained by
   (d) adding InP cores to a solution comprising solvent, a ligand and zinc chloride under an inert atmosphere at a temperature of about 80° C. to about 150° C.;
   (e) adding zinc bromide and gallium trichloride to the solution obtained in (d);
   (f) adding a selenium source to the solution obtained in (e);
   (g) heating the solution obtained in (f) to a temperature of about 150° C. to about 340° C.; and
   (h) allowing the solution obtained in (g) to cool.

10. The method of claim 9, wherein the ligand is lauric acid.

11. A nanostructure film comprising:
   (a) at least one population of nanostructures of claim 1; and
   (b) at least one organic resin.

12. A nanostructure molded article comprising:
   (a) a first conductive layer;
   (b) a second conductive layer; and
   (c) a nanostructure layer between the first conductive layer and the second conductive layer, wherein the nanostructure layer comprises a population of nanostructures of claim 1.

13. A display device comprising the nanostructures of claim 1.

\* \* \* \* \*